United States Patent [19]

Woods et al.

[11] 4,007,294

[45] Feb. 8, 1977

[54] METHOD OF TREATING A LAYER OF SILICON DIOXIDE

[75] Inventors: Murray Henderson Woods; Richard Williams, both of Princeton, N.J.

[73] Assignee: RCA Corporation, New York, N.Y.

[22] Filed: Mar. 8, 1976

[21] Appl. No.: 664,878

Related U.S. Application Data

[63] Continuation-in-part of Ser. No. 476,837, June 6, 1974, abandoned.

[52] U.S. Cl. .................................. 427/39; 148/1.5; 148/186; 204/164; 357/52; 427/82; 427/93; 427/377; 427/379
[51] Int. Cl.[2] ............................................ B05D 3/06
[58] Field of Search ................ 427/39, 82, 93, 377, 427/379; 148/1.5, 183, 186; 204/164; 357/52

[56] References Cited

UNITED STATES PATENTS

| | | | |
|---|---|---|---|
| 3,556,879 | 1/1971 | Mayer | 148/191 |
| 3,698,945 | 10/1972 | Yokozawa et al. | 427/93 |
| 3,711,324 | 1/1973 | Glendinning et al. | 357/52 |
| 3,755,092 | 8/1973 | Antola | 204/164 |

*Primary Examiner*—John H. Newsome
*Attorney, Agent, or Firm*—H. Christoffersen; T. H. Magee

[57] ABSTRACT

A layer of silicon dioxide such as used in an MOS gate dielectric, is treated, after growth, to prevent deleterious effects resulting from any mobile impurity ions therein. An ionic fluoride compound is applied to one surface of the layer of silicon dioxide. A corona discharge is then directed from a negative electrode of a pair of electrodes of opposite polarity onto the fluoride compound to drive the fluoride ions into the layer. The layer is then washed and annealed.

10 Claims, No Drawings

METHOD OF TREATING A LAYER OF SILICON DIOXIDE

This application is a continuation-in-part application of U.S. patent application Ser. No. 476,837, filed on June 6, 1974 now abandoned.

This invention relates to a method of treating a layer of silicon dioxide. More particularly, the invention relates to a method of stabilizing the gate dielectric of an MOS (metal-oxide-semiconductor) device. The novel method of the present invention is particularly useful in the manufacture of stable MOS devices utilizing silicon dioxide as a gate dielectric.

It is well known in the manufacture of an MOS device that if certain impurities get into the gate dielectric, either during its growth or during the processing of the MOS device, the device will be unstable and perform poorly. An important source of this instability and poor performance is the presence of mobile positive ions, such as sodium and lithium, for example, in the dielectric ($SiO_2$) layer. It has been proposed to introduce chlorine into the silicon dioxide gate dielectric layer during its growth to neutralize and/or to immobilize the positive impurity ions to improve the stability of the MOS device. While such a prior-art method is satisfactory for growing a layer of silicon dioxide, the method requires a relatively high temperature (about 1100° C) that is undesirable in the manufacture of certain semiconductor devices. The novel method of the present invention does not require temperatures greater than 180° C, and the method is utilized only after the growth of the silicon dioxide layer.

The novel method also applies to deposited dielectric glasses or oxides used for passivation purposes, and whatever is described and claimed for a layer of silicon dioxide also applies to a layer of dielectric glass.

In accordance with the novel method of the present invention, since a layer of silicon dioxide of an MOS device is treated only after it is formed, that is, not during growth or deposition of the layer, the novel method increases the flexibility of processing semiconductor devices, and provides protection against impurities that may be introduced into the silicon dioxide layer after its growth.

Briefly, the novel method of treating a layer of silicon dioxide comprises (a) applying an ionic fluoride compound to one surface of the silicon dioxide layer, and (b) directing a corona discharge from a negative electrode of a pair of electrodes of opposite polarity onto the fluoride compound to drive the fluoride ions into the layer. Finally, the layer is washed and annealed.

The novel method is based on our observation that negative fluoride ions, $F^-$, can be injected into the surface of a layer of silicon dioxide (of about 1000A in thickness on a silicon substrate) and transported into the layer. The ionic fluoride compound, which is the source of the negative fluoride ions, may be applied to the surface of the silicon dioxide layer by any technique which is not damaging to the semiconductor devices being manufactured.

One technique which may be used to introduce the $F^-$ ions is to coat the outer surface of the layer of silicon dioxide, as on a substrate of silicon, with an aqueous solution of a soluble ionic fluoride compound. The compound can be a salt, such as potassium fluoride, sodium fluoride, or ammonium fluoride, for example. The silicon dioxide layer is then dried, as in a desiccator, to remove the solvent, leaving a thin layer of the solid solute on the surface of the layer.

A preferred technique for applying the ionic fluoride compound is to vapor deposit a layer of the ionic fluoride compound onto the outer (exposed) surface of the silicon dioxide layer. For example, a thin (approximately 200A) layer of magnesium fluoride may be vacuum deposited onto the outer surface of the oxide in an evacuated evaporation chamber, using conventional physical vapor deposition techniques. Such techniques are described in detail in *Vapor Deposition*, C. F. Powell, J. H. Oxley and J. M. Blocher, Jr., John Wiley & Sons, Inc., 1967, Chapter 8, the disclosure of which is incorporated herein by reference. We believe that a vapor-deposited ionic fluoride layer, such as the aforementioned magnesium fluoride layer, will give a more uniform injection of fluorine than the evaporated solution technique, and thus will provide superior results in processing semiconductor devices.

After applying the ionic fluoride compound to the surface of the silicon dioxide layer, the surface of the layer is then charged negatively with a corona discharge (of approximately −5000 volts or greater magnitude) in air while the opposite surface of the layer on the silicon substrate is electrically connected to ground (through the substrate), that is, connected to a source of potential more positive than said negative corona discharge. The $F^-$ ions of the ionic fluoride compound drift into the silicon dioxide layer, due to the influence of the high electric field produced by the corona discharge, and they influence the silicon-silicon dioxide interface. The influence of the $F^-$ ions on the silicon dioxide-silicon interface can be detected by C–V (capacitance-voltage) measurements, in a manner well known in the art.

The surface of the silicon dioxide layer is now cleaned, as by washing it with deionized water, to remove any of the fluoride compound thereon, and annealed in air at a temperature of at least 180° C for at least 15 minutes.

Before annealing, the presence of the $F^-$ ions is detected by measuring the ac capacitance of the treated silicon dioxide layer as a function of dc bias. This is the standard C–V measurement used in MOS diagnostics. After annealing, the negative charges of the $F^-$ ions are no longer present, but the fluorine is chemically present and is still able to neutralize and to immobilize mobile positive (impurity) ions in the silicon dioxide layer.

We have observed and tested the aforementioned results with layers of silicon dioxide treated by the novel method. For example, we have prepared a number of MOS capacitors, each comprising a layer of silicon dioxide, having a thickness of about 1,000A, on a substrate of silicon, and an aluminum electrode was deposited on the silicon dioxide layer. The silicon dioxide layers were contaminated with sodium ions during their formation. The slicon dioxide layers of ½ of the MOS capacitors were treated with fluoride ions, in accordance with the novel method, and the silicon dioxide layers of the remaining ½ of the MOS capacitors were left untreated. The MOS capacitors were then evaluated for stability against their initial ionic contamination by bias-temperature tests (C–V measurements). For example, we applied a bias of +10 volts to the aluminum electrode of each MOS capacitor for 5 minutes at a temperature of about 200° C. Each MOS capacitor was then tested by making C–V measurements thereon to determine any flatband shifts. The MOS capacitors, wherein no fluoride ions have been injected in accordance with the novel invention demonstrated flatband shifts in the range of from 0.5 to 6 volts. In the MOS capacitors that were treated with fluoride ions in accordance with the novel method, substantially no flatband shifts were observed. The fluoride ions apparently neutralized and/or immobilized the initially contaminating positive sodium ions in the silicon dioxide layers. It was also observed that when the fluoride ions were introduced into the silicon dioxide layers prior to the introduction of the contaminating sodium ions (the sodium ions having been introduced with a corona discharge from a positive electrode of a pair of electrodes of opposite polarity on a dried sodium salt on the surface of the silicon dioxide layer), the contaminating positive sodium ions were also neutralized and/or immobilized.

What is claimed is:

1. A method of treating a layer of silicon dioxide having a pair of opposite surfaces comprising the steps of:
    applying an ionic fluoride compound to one surface of said layer of silicon dioxide, and
    directing a corona discharge onto said one surface between a negative electrode spaced from said one surface of said silicon dioxide layer, and the other surface of said silicon dioxide layer which is connected to a source of potential more positive than said negative electrode to drive fluoride ions of said compound into said layer of silicon dioxide.

2. A method as recited in claim 1 wherein the step of applying said ionic fluoride compound to said one surface of said silicon dioxide layer is performed by:
    coating said one surface of said silicon dioxide layer with a solution of a solute of said ionic fluoride compound in a solvent, and
    drying said solution to remove said solvent, whereby said solute of ionic fluoride compound remains on said one surface.

3. A method as recited in claim 2 wherein:
    said solute consists of a salt chosen from the group consisting of potassium fluoride, sodium fluoride, and ammonium fluoride, and
    said solvent comprises water.

4. A method as recited in claim 2 wherein the step of drying said solution is performed by placing said silicon dioxide layer in a desiccator to remove said solvent from said solution at room temperature.

5. A method as recited in claim 1 wherein the step of applying said ionic fluoride compound to said one surface of said silicon dioxide layer is performed by vapor depositing a layer of said ionic fluoride compound onto said one surface of said silicon dioxide layer.

6. A method as recited in claim 5 wherein said ionic fluoride compound is a salt chosen from the group consisting of magnesium fluoride, potassium fluoride, sodium fluoride, and ammonium fluoride.

7. A method as recited in claim 5 wherein the thickness of said vapor-deposited layer of said ionic fluoride compound is about 200A.

8. A method as recited in claim 1 further comprising the steps of washing off said ionic fluoride compound with deionized water after performing the step of directing said corona discharge onto said one surface.

9. A method as recited in claim 8 further comprising the step of annealing said silicon dioxide layer at a temperature of at least 180° C for at least 15 minutes.

10. A method as recited in claim 1 wherein the step of directing said corona discharge onto said one surface is carried out in air.

* * * * *